US006333777B1

(12) United States Patent
Sato

(10) Patent No.: US 6,333,777 B1
(45) **Date of Patent: *Dec. 25, 2001**

(54) EXPOSURE APPARATUS AND DEVICE MANUFACTURING METHOD

(75) Inventor: Hiroshi Sato, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,883

(22) Filed: Jul. 16, 1998

(30) Foreign Application Priority Data

Jul. 18, 1997 (JP) .................................................. 9-209939

(51) Int. Cl.[7] .......................... G03B 27/42; G03B 27/54; G03B 7/74

(52) U.S. Cl. ................................ 355/53; 355/67; 355/68

(58) Field of Search ................................ 355/53, 67, 68, 355/69; 250/492, 22

(56) References Cited

U.S. PATENT DOCUMENTS 5,739,899 * 4/1998 Nishi et al. ............................ 355/53
5,798,824 * 8/1998 Kudo ...................................... 355/67
5,861,944 * 1/1999 Nishi ...................................... 355/68
5,883,704 * 3/1999 Nishi et al. ............................ 355/67
5,991,004 * 11/1999 Wallace et al. ........................ 355/53

FOREIGN PATENT DOCUMENTS 3-65623 3/1991 (JP) .
5-47626 2/1993 (JP) .
5-47629 2/1993 (JP) .
5-47640 2/1993 (JP) .
6-204123 7/1994 (JP) .
7-29816 1/1995 (JP) .
9-190969 7/1997 (JP) .

* cited by examiner

*Primary Examiner*—Russell Adams
*Assistant Examiner*—Peter B. Kim
(74) *Attorney, Agent, or Firm*—Fitzpatrick, Cella, Harper & Scinto

(57) ABSTRACT

A projection exposure apparatus for illuminating a pattern of a mask with illumination light from an illumination system and for projecting an image of the pattern onto a substrate through a projection optical system. The apparatus includes a masking device included in the illumination system and disposed on a plane optically conjugate with a plane on which the pattern of the mask is disposed, the masking device having a variable-size aperture for defining an exposure area in an image plane of the projection optical system, and an illuminometer disposed at the image plane side of the projection optical system. The illuminometer is movable along the image plane while a light receiving surface thereof is registered with a plane displaced from the image plane to detect a light intensity distribution on the displaced plane when the masking device provides a small aperture. The illumination system includes a movable component for adjusting a light intensity distribution of the displaced plane.

19 Claims, 9 Drawing Sheets

EXPOSURE APPARATUS AND DEVICE MANUFACTURING METHOD

FIELD OF THE INVENTION AND RELATED ART

This invention relates to an exposure apparatus and a device manufacturing method. More particularly, the invention is concerned with an exposure apparatus and/or a device manufacturing method which assures high resolution and which is suitable for the manufacture of devices on the basis of a step-and-repeat procedure or a step-and-scan procedure.

For projection exposure apparatuses for recent semiconductor device manufacture, a performance capable of forming a higher resolution pattern has been required to meet a further enlargement of integration, such as VLSI, for example.

As an attempt to provide a projection exposure apparatus that meets this requirement, Japanese Laid-Open Patent Application, Laid-Open No. 47629/1993 or Laid-Open No. 204123/1994 proposes a projection exposure apparatus which uses an ultra-resolution imaging technique called an oblique incidence illumination or phase shift mask. In such systems, the diameter of an aperture of an aperture stop provided in an illumination system is reduced to make a σ value (the ratio of the numerical aperture of a projection optical system and the numerical aperture of an illumination optical system) smaller. Alternatively, the surface to be illuminated is illuminated with a secondary light source of a specific shape such as a ring-like shape or quadrant-pole shape.

On the other hand, in order that a projection exposure apparatus provides a sufficient resolving power, the angle light quantity distribution of illumination light flux for illuminating a certain point on a mask or a wafer (i.e., the angular distribution of illumination light) should be set to a best state or a state near it. If illumination light set to such a state cannot be supplied to the projection optical system, there occurs a lateral deviation of an image if the wafer is defocused.

SUMMARY OF THE INVENTION

It is an object of the present invention to provide an exposure apparatus and/or a device manufacturing method by which a pattern of a mark or reticle (hereinafter, "mask") can be projected onto a substrate such as a wafer, for example, with high resolution.

In accordance with an aspect of the present invention, there is provided an exposure apparatus for illuminating a pattern with exposure light and for projecting the pattern onto a substrate through a projection optical system, said apparatus comprising: an illuminometer being movable along a pattern projection plane with its light receiving portion being registered with the pattern projection plane and movable along an optical axis direction of the projection optical system, for measurement of an illuminance distribution on the pattern projection plane; and masking means having a variable size aperture, for regulating an exposure range on the pattern projection plane; wherein said masking means serves to regulate the exposure range so that a light intensity distribution at a pupil plane of the optical system is defined at a plane displaced from the pattern projection plane in the optical axis direction, and wherein said illuminometer is moved along the displaced plane while the light receiving portion of said illuminometer is registered with the displaced plane, to perform the measurement of the light intensity distribution.

In accordance with a further aspect of the present invention, there is provided an exposure apparatus for illuminating a pattern with exposure light and for projecting the pattern onto a substrate through a projection optical system, said apparatus comprising: an illuminometer being movable along a pattern projection plane with its light receiving portion being registered with the pattern projection plane and movable along an optical axis direction of the projection optical system, for measurement of an illuminance distribution on the pattern projection plane; and masking means having a variable size aperture, for regulating an exposure range on the pattern projection plane; wherein said masking means serves to regulate the exposure range so that a shift of a chief ray of the exposure light is defined on a plane displaced from the pattern projection plane in the optical axis direction, and wherein said illuminometer is moved along the displaced plane while the light receiving portion of said illuminometer is registered with the displaced plane, to perform the measurement of the shift of the chief ray.

In accordance with a yet further aspect of the present invention, there is provided an exposure apparatus for illuminating a pattern with exposure light and for projecting the pattern onto a substrate through a projection optical system which is telecentric on its light exit side, said apparatus comprising: a detector for detecting an amount of tilt of a chief ray of the exposure light with respect to an optical axis of the projection optical system; adjusting means for adjusting a tilt angle of the chief ray of the exposure light in accordance with the detection by said detector, to bring the chief ray of the exposure light parallel to the optical axis of the projection optical system; and correcting means for correcting non-uniformness of illuminance on a pattern projection plane to be produced by the adjustment through said adjusting means.

In accordance with a still further aspect of the present invention, there is provided an exposure apparatus for projecting a pattern onto a substrate with exposure light through a projection optical system, said apparatus comprising: a detector for detecting asymmetry of a light intensity distribution upon a pupil plane of the projection optical system; adjusting means for adjusting the exposure light in accordance with the detection by said detector, to bring the intensity distribution on the pupil plane into symmetry with respect to an exposure optical axis; and correcting means for correcting non-uniformness of illuminance on a pattern projection plane to be produced by the adjustment through said adjusting means.

In accordance with a yet further aspect of the present invention, there is provided a projection exposure apparatus for illuminating a pattern with illumination light from an illumination system and for projecting the pattern onto a substrate through a projection optical system, said apparatus comprising: an illuminometer disposed at a predetermined distance away from a pattern forming surface or a plane optically conjugate with the pattern forming surface, with respect to an optical axis direction; wherein said illuminometer serves to detect an angular distribution of the illumination light; and wherein a component of the illumination system is rotationally moved or moved along a plane orthogonal to an optical axis to adjust the angular distribution of the illumination light.

In accordance with another aspect of the present invention, there is provided a projection exposure apparatus for illuminating a pattern with illumination light from an illumination system and for projecting the pattern onto a substrate through a projection optical system, said apparatus comprising: masking means included In the illumination system and disposed on a plans optically conjugate with a pattern forming surface, for regulating the size of a surface to be illuminated; an illuminometer disposed at a predetermined distance away from said masking means or a plane optically conjugate with said masking means, with respect to an optical axis direction, for detecting an angular distribution of the illumination light; wherein a component of the illumination system is rotationally moved or moved along a plane orthogonal to an optical axis to adjust the angular distribution of the illumination light.

The illumination system may include secondary light source forming means sucb as a fly's eye lens, for example.

The component of the illumination system may comprise a lens system disposed at a light entrance side of said secondary light source forming means.

The component of the illumination system may comprise a parallel flat plate disposed at a light entrance side of said secondary light source forming means.

The component of the illumination system may comprise an optical member having a wedge shaped section, disposed at a light entrance side of said secondary light source forming means.

The component of the illumination system may comprise a stop member having a constant or variable aperture diameter, disposed at a light entrance side of said secondary light source forming means.

The projection exposure apparatus may further comprise a main control for measuring non-uniformness of illuminance on the pattern forming surface or on the plane conjugate therewith, on the basis of a signal from said illuminometer, and illuminance correcting means disposed along a light path of the illumination system, for correcting non-uniformness of illuminance on the basis of a signal from said main control.

In accordance with a yet further aspect of the present invention, there is provided a device manufacturing method, comprising the steps of: projecting and transferring a device pattern of a mask or reticle onto a substrate to be exposed, such as a wafer, by use of an exposure apparatus such as described above or a projection exposure apparatus such as described above; and developing the substrate after the pattern projection.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
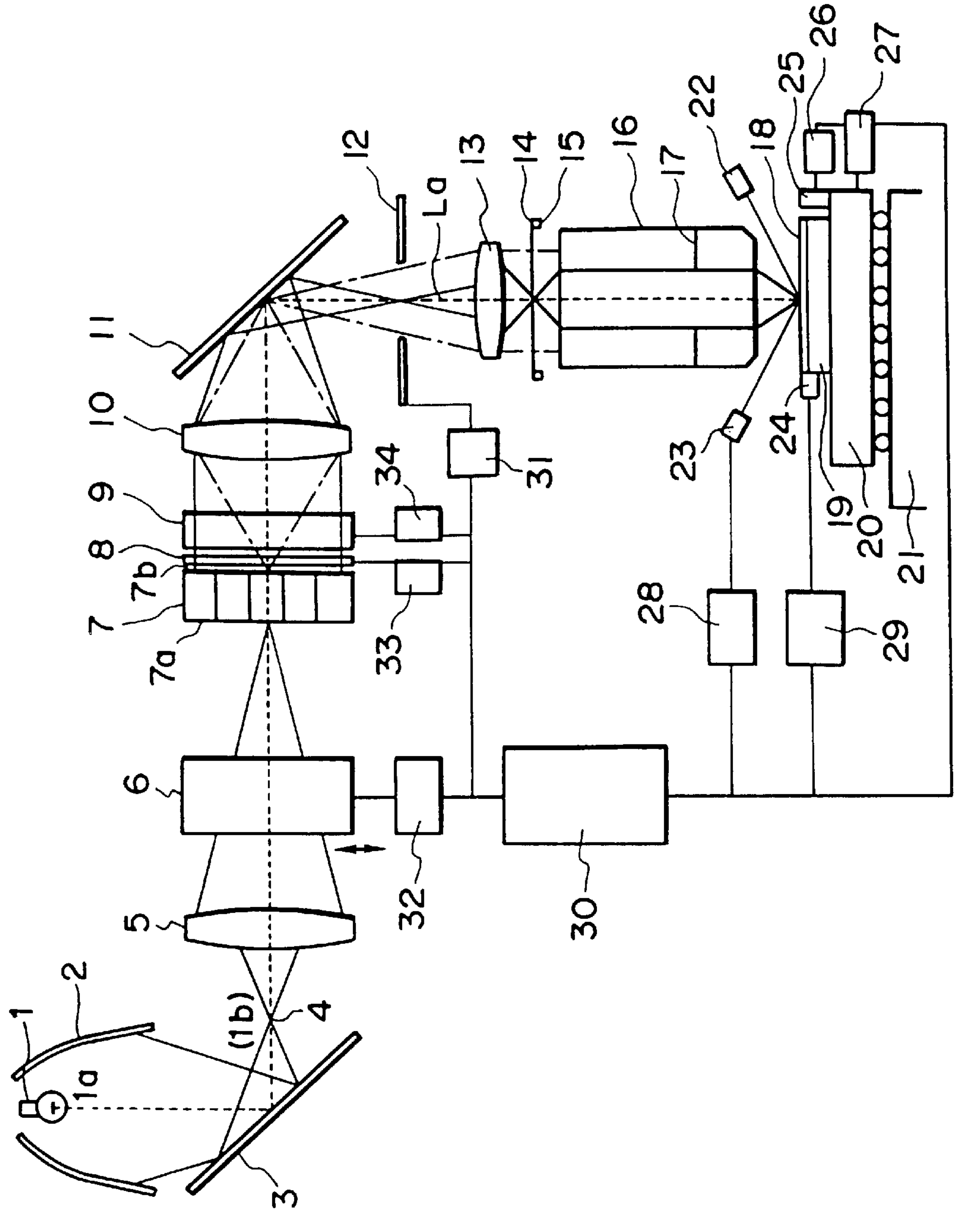
FIG. 1 is a schematic view of an optical arrangement according to a first embodiment of the present invention.

FIG. 1 is a schematic view of a main portion of a first embodiment of the present invention. In this embodiment, the invention is applied to a step-and-repeat type or step-and-scan type projection exposure apparatus for a lithographic process of a quarter micron order or less.

Denoted in the drawing at 1 is a light emitting tube (light source) such as a Hg lamp, for example. The light emitting tube 1 has a high luminance light emitting portion 1*a* for emitting ultraviolet rays or deep ultraviolet rays. The light emitting portion 1*a* is disposed at or adjacent to a first focal point of an elliptical mirror 2. By this elliptical mirror 2, the light emitting portion 1*a* is imaged at or adjacent to a second focal point of the elliptical mirror 2. Denoted at 3 is a cold mirror which comprises a multilayered film, for transmitting most of the infrared light and for reflecting most of the ultraviolet light. The elliptical mirror 2 serves in cooperation with the cold mirror 3 to form an image (light source image) 1*b* of the light emitting portion 1*a*, at or adjacent to the second focal point, as denoted at 4.

Denoted at 5 is an optical system which comprises a condenser lens, a collimator lens and a zoom lens, for example. The optical system 5 serves in cooperation with a movable lens system (illumination state adjusting means) 6 to image the light source image 1*b*, formed at or adjacent to the second focal point, upon a light entrance surface 7*a* of an optical integrator (secondary light source forming means) 7.

The lens system 6 serves as adjusting means for adjusting an incidence angle of illumination light (incidence angle of a chief ray) impinging on the surface to be illuminated, such as the surface of a pattern of a reticle, for example. The lens system 6 is movable through a lens driving system 32, along an optical axis direction and also two-dimensionally along a plane perpendicular to the optical axis.

The optical integrator 7 comprises a plurality of small lenses arrayed two-dimensionally at a predetermined pitch, each having a rectangular sectional shape. It serves to produce secondary light sources in the neighborhood of its light exit surface 7*b*, corresponding to the small lenses, respectively. There is a stop 8 adjacent to the light exit surface 7*b* of the optical integrator 7, and the size and shape of the aperture of the stop 8 can be changed by means of a stop driving mechanism 33.

In this embodiment, as proposed in Japanese Laid-Open Patent Application, Laid-Open No. 47626/1993 or Laid-Open No. 47640/1993, plural stops with different aperture shapes are selectively used in accordance with the shape or fineness of a pattern of the reticle 14, thereby to variably define a light intensity distribution (aperture image) upon a pupil 17 of a projection optical system 16.

Denoted at 9 is illuminance non-uniformness correcting means which serves to correct non-uniformness of illuminance upon the pattern surface 14 or a pattern projection plane (image plane), with the use of a driving system 34. Denoted at 10 is a condenser lens for collecting light beams from the secondary light sources, adjacent to the light exit surface 7*b* of the optical integrator 7. The collected light beams are reflected by a mirror 11, to illuminate the surface of a masking blade 12 which can be regarded as a surface to be illuminated. The light beams are superposed one upon another on the masking blade 12 surface, whereby it is illuminated uniformly. Thus, the pattern surface 14 or the pattern projection plane (image plane of the lens 16) can be illuminated uniformly, in principle.

The masking blade 12 comprises plural movable light blocking plates and, by means of a masking blade driving system 31, a desired aperture shape can be defined and the exposure range upon the wafer 18 surface is regulated. Denoted at 13 is an imaging lens which serves to project the aperture (aperture shape) of the masking blade 12 onto the pattern surface of the reticle 14 which is a surface to be illuminated, such that a necessary region on the reticle 14 surface can be illuminated uniformly. The reticle 14 is held by a reticle stage 15.

Denoted at 16 is the projection optical system (projection lens) for projecting a circuit pattern of the reticle 14 in a reduced scale. It comprises an optical system being telecentric on the light exit side. Denoted at 17 is a pupil of the projection optical system 16, and denoted at 18 is a wafer (substrate) to be disposed on the pattern projection plane position, so that the circuit pattern of the reticle 14 is to be projected and transferred thereto. Denoted at 19 is a wafer chuck for holding the wafer 18 and being movable along the optical axis direction. Denoted at 20 is an X-Y stage for holding the wafer chuck 19 and being movable two-dimensionally along a plane orthogonal to the optical axis. Denoted at 21 is a base table on which the projection lens 16 and the X-Y stage 20, for example, are mounted. The X-Y stage 20 has a structure for upward and downward motion by a predetermined amount, along the optical axis La direction, for measurement of an angular distribution (angular characteristic) of illumination light to be described later.

In the optical arrangement according to this embodiment, the light emitting portion 1*a*, the second focal point 4, the light entrance surface of the optical integrator 7, the masking blade 12, and pattern surfaces of the reticle 14 and the wafer 18 are disposed in a mutually conjugate relation. Also, the aperture (light exit surface) of the stop 8 and the pupil 17 of the projection optical system 16 are disposed in an approximately conjugate relation with each other.

Denoted at 22 and 23 are components of a surface position detecting system for detecting positional information (level information) of the wafer 18 surface with respect to the optical axis direction. Here, denoted at 22 is an illumination system for illuminating the wafer 18 in an oblique direction and denoted at 23 is a light receiving system for receiving reflection light from the wafer 18 surface and for producing a signal corresponding to the surface position of the wafer 18. Denoted at 28 is a control system for controlling the illumination system 22 and the light receiving system 23.

Denoted at 25 is a reflection mirror fixedly mounted on the X-Y stage 20, and denoted at 26 is a laser interferometer for projecting laser light to the reflection surface of the mirror 25 to detect displacement of the X-Y stage 20. Denoted at 27 is a driving system for controlling movement of the X-Y stage 20 on the basis of an output of the laser interferometer 26.

The driving system 27 receives surface positional information related to the level (height) of the wafer 18 surface, supplied from the control system 28, and, by moving the wafer chuck 19 in the optical axis direction, it brings the wafer 18 surface into registration with the imaging plane of the device pattern of the reticle 14 defined by the projection lens system 16.

Denoted at 24 is an illuminometer (photodetector) for detecting an angular distribution of illumination light impinging on the pattern projection plane (image plane) at which the wafer 18 surface is to be set, and detecting an illuminance distribution on the pattern projection plane. It can be moved through the irradiation picture plane region (i.e., exposure area) together with drive of the X-Y stage, while the light receiving portion of the illuminometer is registered with the image plane of the projection optical system 16, and it receives illumination light. It applies a signal corresponding to the output to a detecting system 29. The illuminometer 24 is movable also in the optical axis La direction.

Denoted at 30 is a main control for controlling the components 27, 28, 29, 31, 32, 33 and 34. Information from the detecting system 29 is supplied to the main control 30.

Figure 2:
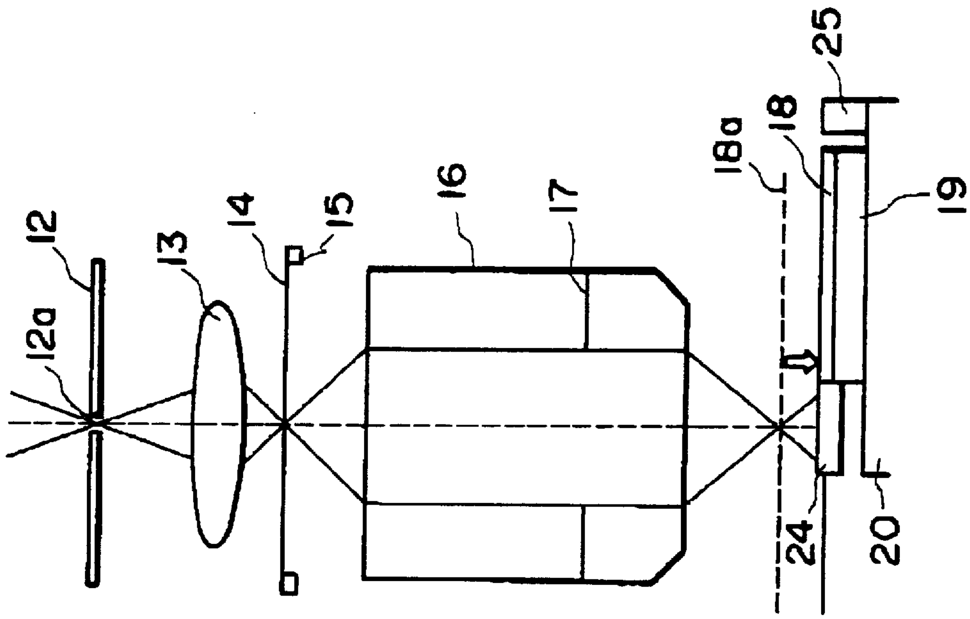
FIG. 2 is a schematic view for explaining an example of a projection optical system.

In this embodiment, the masking blade 12 variably sets its aperture shape or size so that, as shown in FIG. 2, a light intensity distribution of the pupil plane (17 or stop 8) of the optical system appears on a plane 18 which is shifted from the exposure surface (pattern projection plane) 18*a* along the exposure optical axis La direction.

Specifically, the illuminometer 24 measures the light intensity distribution on the pupil plane and asymmetry of the light intensity distribution with respect to the exposure optical axis La which corresponds to the optical axis of the projection optical system 16. Then, on the basis of the result of detection by the illuminometer 24, the lens system (adjusting means) 6 is moved to adjust the light intensity distribution on the pupil plane so that it becomes symmetric with respect to the exposure optical axis.

In another aspect, it can be said that the masking blade 12 variably sets its aperture shape or size so that, as shown in FIG. 2, a deviation of a chief ray of the exposure light appears on the plane 18 which is shifted from the exposure surface 18*a* along the exposure optical axis La direction. The illuminometer 24 can measure such a deviation of the chief ray on that occasion.

The illuminometer 24 may detect the amount of tilt of the chief ray of the exposure light, impinging on the wafer, with respect to the optical axis La of the optical system (5–16). On the basis of a signal from the illuminometer 24, the lens system 6 may be driven to adjust the tilt angle of the chief ray of the exposure light.

Next, measurement of an angular distribution of illumination light projected from the projection optical system 16 will be explained. Here, the angular distribution of illumination light which enters the projection optical system 16 can be determined by the angular distribution of illumination light emitted from the optical system 16 and the magnification of the projection optical system 16.

A first method will now be described. In an example wherein the angular distribution of illumination light at the picture field center (at optical axis La position) is to be measured, the masking blade driving means 31 operates to move the masking blade 12 to set a small size aperture 12*a* of the blade such that a small amount of illumination light passes only at the optical axis La position. Here, as shown in FIG. 2, the illuminometer 24 is moved to the position approximately on the optical axis La and, additionally, it is placed at a predetermined distance below the position 18*a* of the wafer surface (pattern projection plane), i.e., the image plane.

Only the illumination light from the small aperture 12*a*, restricted by the masking blade 12, is once imaged at the position 18*a* and, thereafter, the light impinges on the illuminometer 24 while the illumination angle is kept reflected. The light intensity at that time is measured by the illuminometer 24 while it is moved two-dimensionally by the X-Y stage. The results of the measurement are two-dimensionally plotted.

The angular distribution of the illumination light is discriminated in this manner. If the angular distribution of the illumination light is to be measured at a point other than the optical axis La position on the image plane (wafer 18 surface position), the small aperture 12*a* of the masking blade 12 may be set to the position in the masking blade plane corresponding to the point of measurement to be made. Also, the X-Y stage 20 may be moved two-dimensionally so as to place the illuminometer 24 at the desired measurement position and below the wafer surface position 18*a* by a predetermined distance. Then, a measurement may be made.

A second method will now be explained. The second method uses, in place of the illuminometer 24, a combination of a light blocking plate 41 and a CCD 42 such as shown in FIG. 3.

Figure 3:
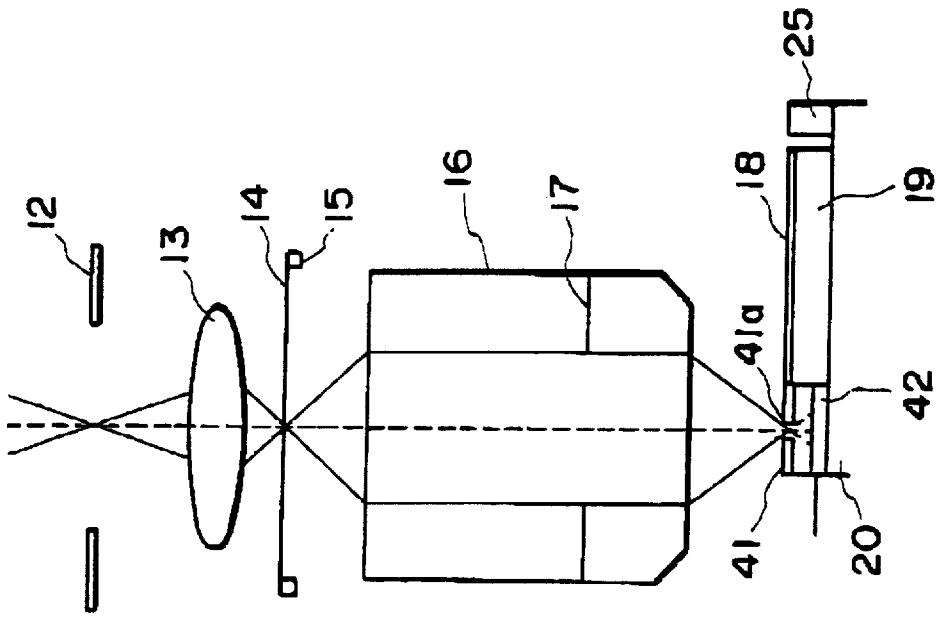
FIG. 3 is a schematic view of a modified form of the first embodiment of the present invention.

In FIG. 3, denoted at 41 is a light blocking plate having a pinhole at its center. Denoted at 42 is a photoelectric converting device array such as a CCD, for example. The light blocking plate 41 is set within the same plane as the wafer 18 surface, and the CCD 42 is disposed at a position spaced below the light blocking plate 41 by a predetermined distance such that it receives the light transmitted through the pinhole of the light blocking plate 41.

On an occasion when the angular distribution of illumination light at the picture field center (at the optical axis La position) is to be measured, the X-Y stage 20 is moved so that the pinhole 41*a* of the light blocking plate 41 is placed at the optical axis La position. Then, only the illumination light as restricted by the pinhole 41*a* can impinge on the CCD 42 with the illumination angle being kept reflected. The results of measurement of light intensities at picture elements of the CCD 42 may be two-dimensionally plotted, by which an angular distribution of illumination light can be discriminated.

If the angular distribution of illumination light at a point other than the optical axis La position on the wafer 18 surface is to be measured, the X-Y stage 20 may be moved two-dimensionally so that the pinhole 41*a* of the light blocking plate 41 is placed at the desired measurement position.

Figure 4A:
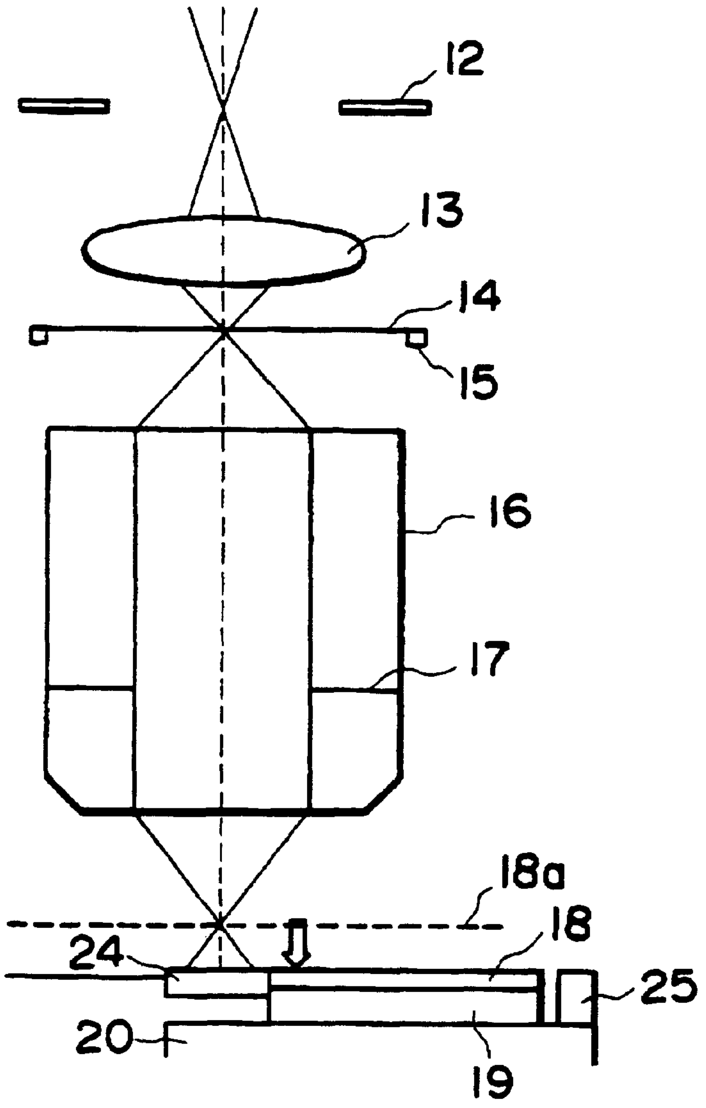
FIGS. 4A and 4B are schematic views, respectively, for explaining a modified form of the first embodiment of the present invention and a reticle to be used therewith.
Figure 4B:
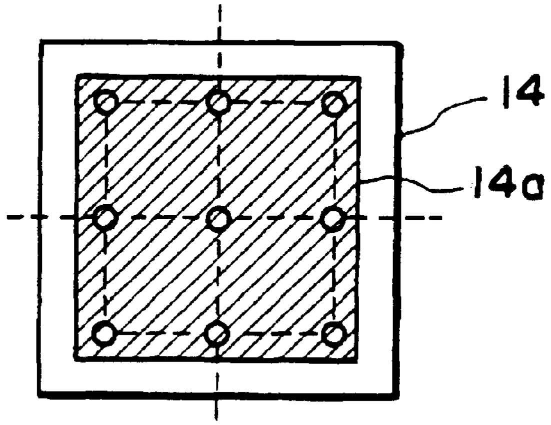
Figure 5A:
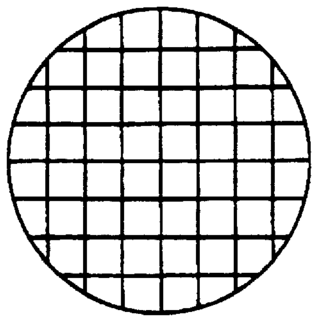
FIGS. 5A–5D are schematic views, respectively, for explaining examples of division sensor means in an embodiment of the present invention.
Figure 5B:
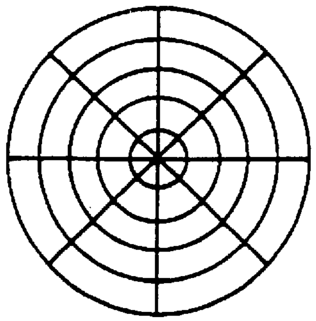
Figure 5C:
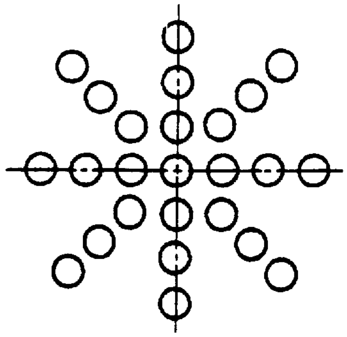
Figure 5D:
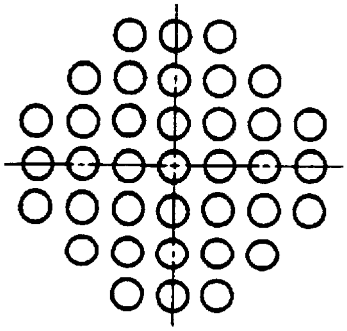

A third method will now be explained. In the third method, the angular distribution of illumination light is measured at the picture field center (optical axis La position) and at those points disposed within the picture field in a grid-like fashion, for example. To this end, a reticle 14, such as shown in FIG. 4B, having a small size transmissive pattern 14*a*, is prepared. This reticle 14 is loaded on the reticle stage 15 as shown in FIG. 4A. The illuminometer (detector) 24 is moved to a position, to be measured, in an illumination region on the wafer 18 surface and, additionally, it is placed below the actual wafer surface 18*a* position by a predetermined distance.

Only the illumination light restricted by the reticle 14 of FIG. 4B is once imaged on the wafer surface 18*a* and, thereafter, the light impinges on the illuminometer 24 with the illumination angle kept reflected. While moving the X-Y stage 20 two-dimensionally, the illuminometer 24 measures the light intensity. The results are two-dimensionally plotted. The angular distribution of illumination light can thus be discriminated.

Alternatively, a light blocking plate with a pinhole may be prepared in the neighborhood of the reticle 14, and a mechanism for moving it along the same plane as the reticle 14 surface may be used. Measurement can be done substantially in the same manner as described above, on that occasion.

Since the angular distribution of illumination light measured as described above corresponds to the light intensity distribution at the aperture of the stop 8 or to the light intensity distribution at the pupil plane 17 of the projection optical system 16, the measurement can be regarded as being a measurement of the shape of secondary light sources (i.e., an effective light source distribution) which has a large influence on the formation of the image of the reticle 14 upon the wafer 18.

The illuminometer 24 shown in FIGS. 2 or 4A may comprise a CCD. On that occasion, the light quantity detection in the illuminance non-uniformness measurement is obtainable as the total of outputs of the picture elements of CCD 24. In the measurement of the angular distribution of the illumination light, two-dimensionally distributed outputs of the picture elements of CCD 24 correspond to an output of an angular distribution When a CCD is used for detection of an angular distribution of the illumination light in FIGS. 2 and 4, the intensity distribution of light from the device pattern defined on the pupil plane 17 of the projection lens system 16 may be detected by changing the size of the stop 8, optically conjugate with the pupil plane 17, to several levels with the use of the driving system 34 and by detecting the sum of outputs of the picture elements of the CCD at these levels. On that occasion, the CCD may be replaced by a photodiode.

When a CCD is to be used for detection of the angular distribution of illumination light in FIGS. 2 and 4, either a one-dimensional (linear) CCD or a two-dimensional (area) CCD may be used. Further, a separate line sensor may be used in place of the one-dimensional CCD, and a division sensor such as shown in FIGS. 5A, 5B, 5C or 5D may be used in place of the two-dimensional CCD.

When an angular distribution is measured in the above-described manner, there are cases wherein the angular distribution of illumination light is deviated from an accurate distribution. This corresponds to deviation of telecentricness.

Particularly, in many projection exposure apparatuses, positions of components of the illumination system are so adjusted that illumination light of a best angular characteristic is supplied under a certain standard illumination mode A. Since, however, different illumination modes use different light paths, non-uniformness of an anti-reflection film of an optical element or eccentricity of a lens system show different influences. Thus, there is a possibility that, when the illumination mode is changed to an oblique incidence illumination method or an illumination mode B of a small $\sigma$ value, the angle of the illumination light becomes improper if the components of the illumination system are set to be the same as under the illumination mode A.

A method of correcting a deviation of an angular distribution of the illumination light (deviation of telecentricness) such as described above, will be explained below. FIGS. 6B and 6D show two-dimensional images of the results of the measurement of the angular distribution in respective cases, being made by use of an illuminometer.

Figure 6A:
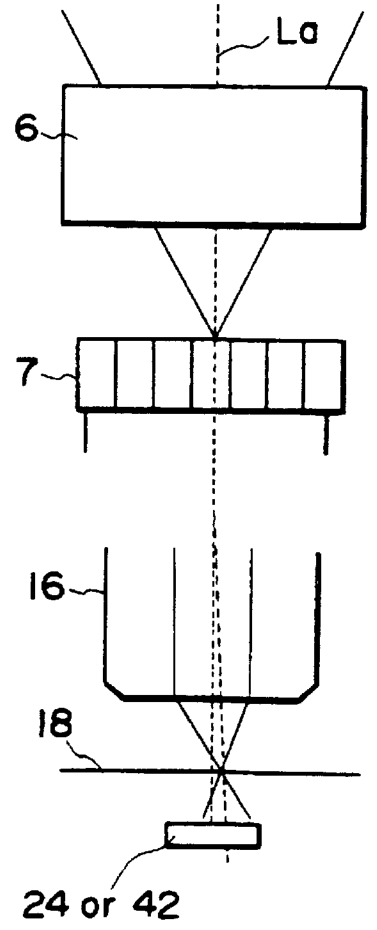
FIGS. 6A–6D are schematic views, respectively, for a explaining correction of shift of an angular distribution of illumination light, in an embodiment of the present invention.
Figure 6C:
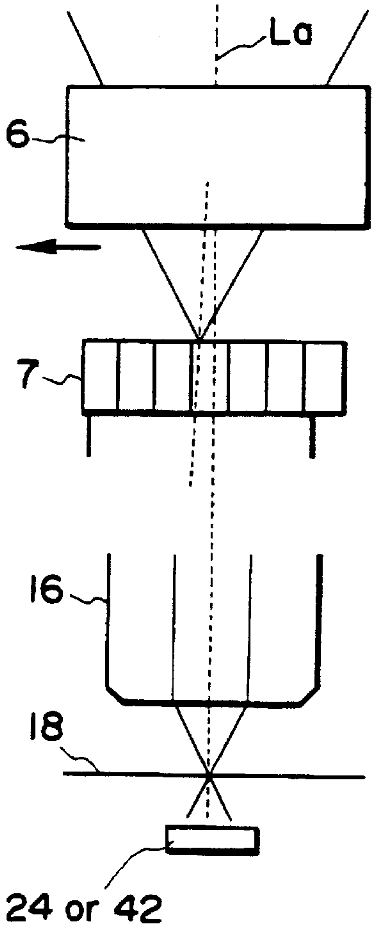
Figure 6B:
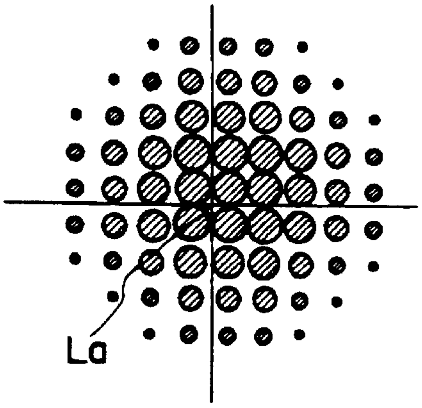
Figure 6D:
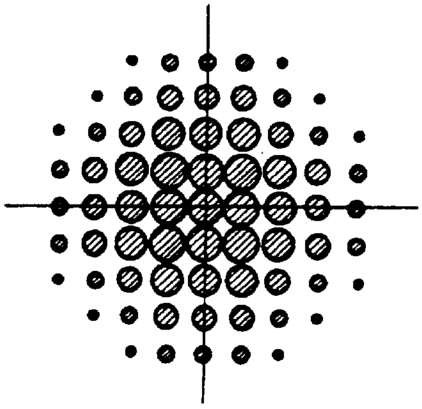

If, as shown in FIGS. 6A and 6B, there is a deviation, on the optical axis La, of an angular distribution of the illumination light, in order to correct or adjust the advancement direction of a chief ray of projected light or an angular distribution of the light, since the wafer surface 18 position and the light entrance surface 7*a* of the optical integrator 7 are conjugate with each other, the direction of light impinging on the optical integrator 7 may well be changed.

In this embodiment, the lens system 6 is moved two-dimensionally along a plane perpendicular to the optical axis, and the functions described above are realized such as shown in FIGS. 6C and 6D.

Figure 7:
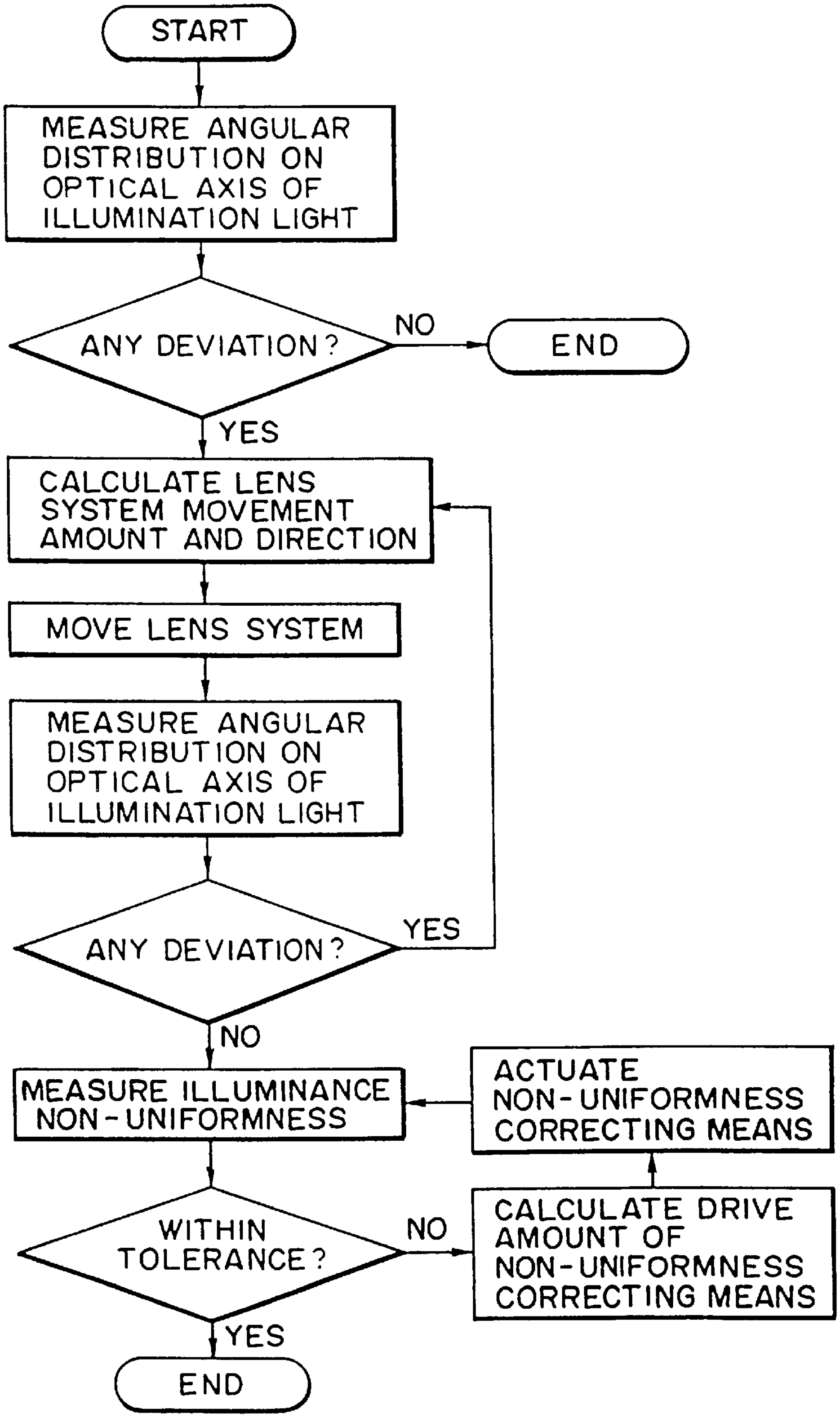
FIG. 7 is a flow chart for explaining a sequence for correcting illumination light angular distribution, in an embodiment of the present invention.

FIG. 7 is a flow chart for explaining the sequence of correcting a deviation of the angular distribution of the illumination light, in accordance with this embodiment.

By using the mechanism described above, the angular distribution, at the optical axis La, of illumination light entering the projection optical system 16 is measured. On the basis of the amount of deviation of the angular distribution of the illumination light obtained through the detecting system 29, the main control 30 calculates the direction and amount of movement of the lens system 6 to be made, and it applies to the lens system driving system 32 a signal corresponding to the driving direction and driving amount. In response to the signal from the main control 30, the lens system driving system 32 moves the lens system 6 in the determined direction and by the determined amount, two-dimensionally. After the driving is completed, measurement of the angular distribution of the illumination light is repeated. If an optimum value has been reached, the sequence goes to a subsequent step. If not, the above-described procedure is repeated until the optimum value is reached.

After the best angular distribution of the illumination light is accomplished, non-uniformness of illuminance upon the surface 14 to be illuminated (image plane corresponding to the wafer 18 surface) is measured by using the detector 24, and then, whether a standard value is satisfied or not is discriminated. This is because, with the drive of the lens system 6, the illuminance distribution upon the light entrance surface 7*a* of the optical integrator 7 may change, which, in turn, may cause a degradation of the illuminance distribution on the surface to be illuminated (i.e., an image plane corresponding to the wafer 18 surface). If the non-uniformness satisfies the standard value, the sequence is finished. If the illuminance non-uniformness does not satisfy the standard, the main control 30 performs a calculation on the basis of the measured value and causes the driving system 34 to actuate the illuminance non-uniformness correcting mechanism 9, to thereby correct the non-uniform illuminance. After that, measurement of the illuminance non-uniformness is repeated. If the non-uniformness satisfies the standard value, the sequence is finished. If not, the illuminance non-uniformness correcting procedure is repeated until the standard value is satisfied.

The illuminance non-uniformness correcting means 8 of this embodiment may use a tilted parallel flat plate or a wedge-shaped optical element, having a coating whose transmission factor varies with incidence angle of the illumination light, as proposed in Japanese Laid-Open Patent Application, Laid-Open No. 190969/1997. Alternatively, it may use an optical filter such as an ND filter, for example, provided on the light entrance surface of the optical integrator 7, which filter may be moved in a direction perpendicular to the optical axis to perform correction.

Figure 8:
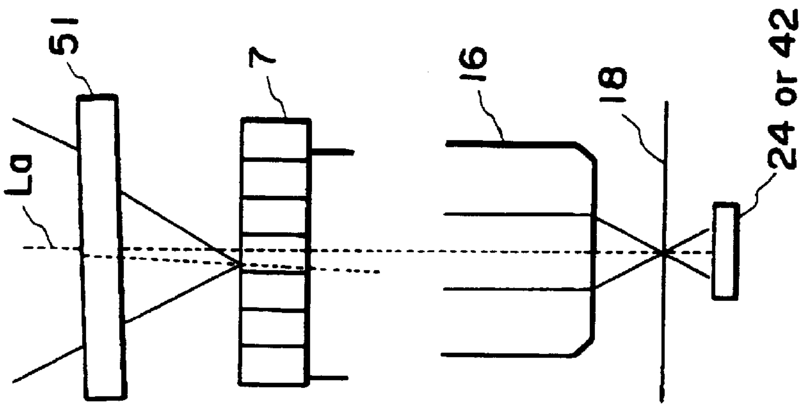

While the foregoing embodiment has been described with reference to an example wherein, for correction of the angular distribution of the illumination light, the lens system 6 is moved two-dimensionally along a plane perpendicular to the optical axis, a parallel flat plate 51 (FIG. 8) having a certain thickness may be provided on the light path of the illumination system. The plate may be rotationally moved and thus tilted by a predetermined angle, to thereby displace the incidence position upon the optical integrator 7.

Figure 9:
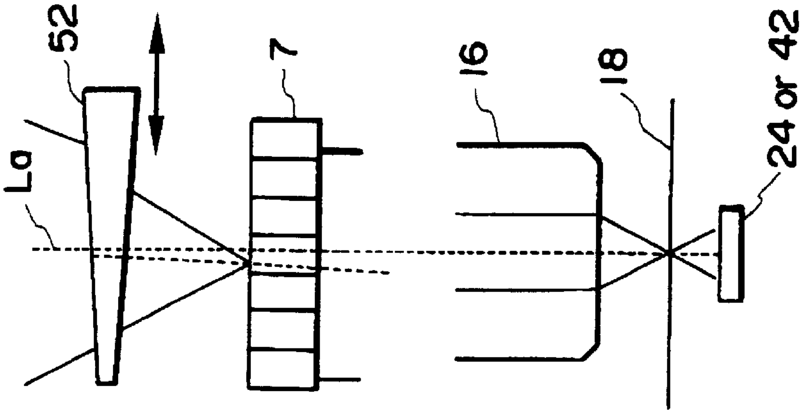

For correction of the angular distribution of the illumination light, as shown in FIG. 9, a wedge-shaped optical member 52 having a certain angle may be demountably mounted on the light path, thereby to shift the incidence position of light upon the optical integrator 7.

Figure 10:
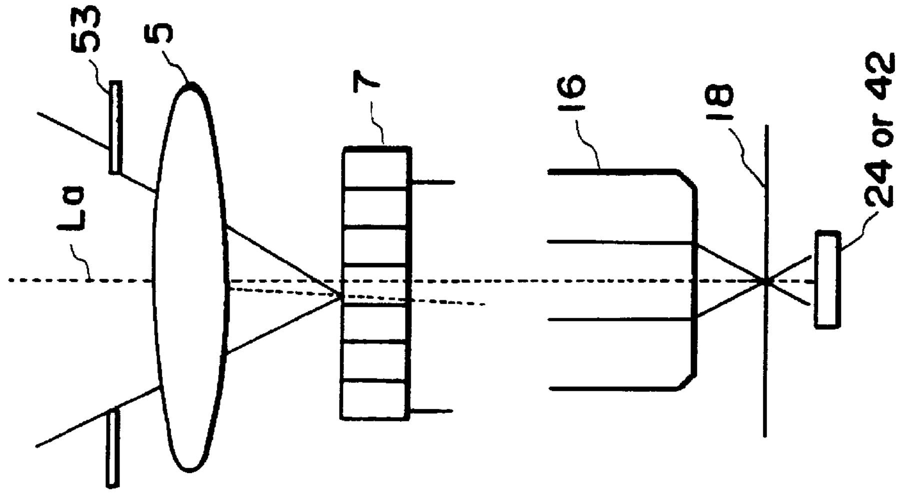
FIGS. 8, 9 and 10 are schematic views, respectively, for explaining further embodiments of the present invention, respectively.

Further, for correction of the angular distribution of the illumination light, while there may be some loss of light quantity, a stop 53 (FIG. 10) may be provided between an optical system 5 and a light source 1. The stop 53 may be moved two-dimensionally along a plane perpendicular to the optical axis La, thereby to shift the incidence position upon the optical integrator 7.

Although the present embodiment has been explained with reference to a step-and-repeat type projection exposure apparatus, the invention is similarly applicable also to a step-and-repeat type projection exposure apparatus.

While this embodiment uses a light source of a Hg lamp for forming an effective light source, the formation of an effective light source may be provided by use of a laser, for example, without a mechanical difference to this embodiment.

Next, an embodiment of a device manufacturing method which uses a projection exposure apparatus such as described above, will be explained.

Figure 11:
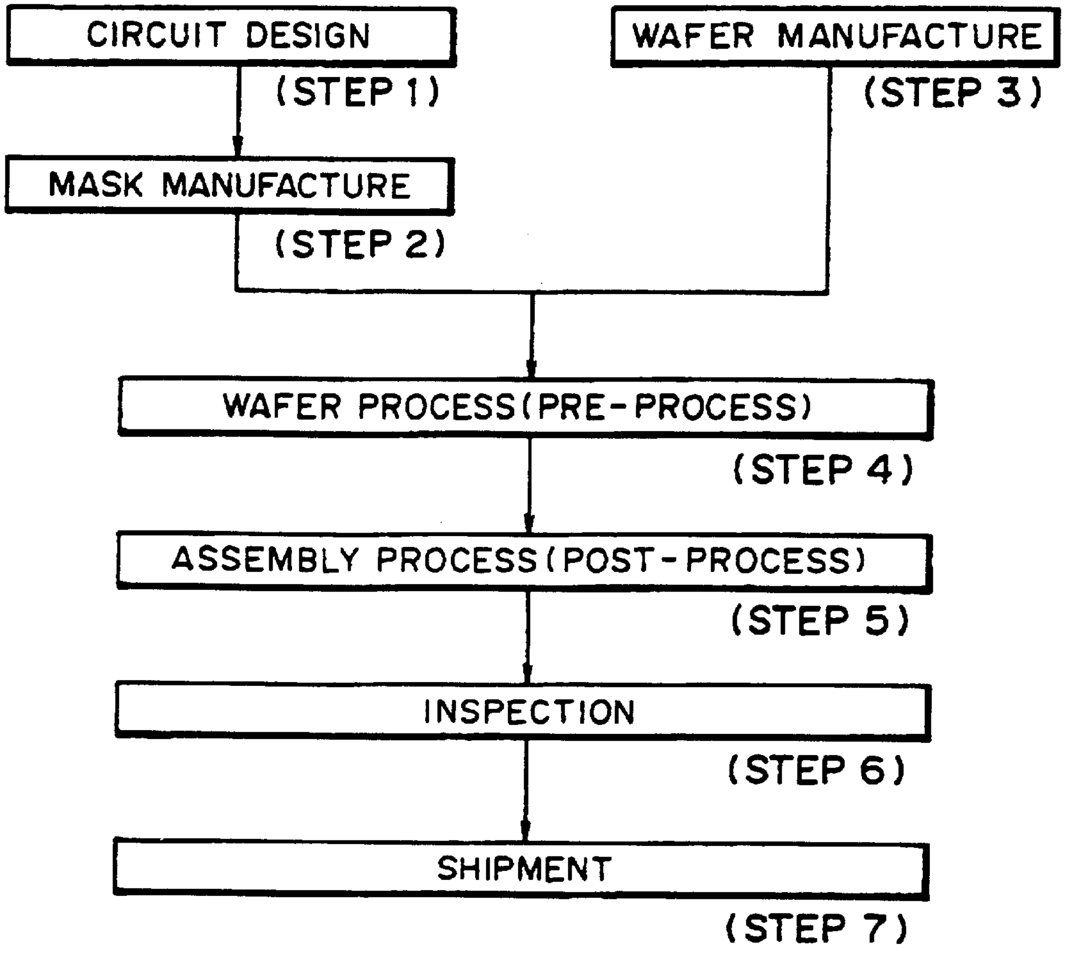
FIG. 11 is a flow chart of device manufacturing processes according to an embodiment of the present invention.

FIG. 11 is a flow chart of a procedure for the manufacture of semiconductor devices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 12:
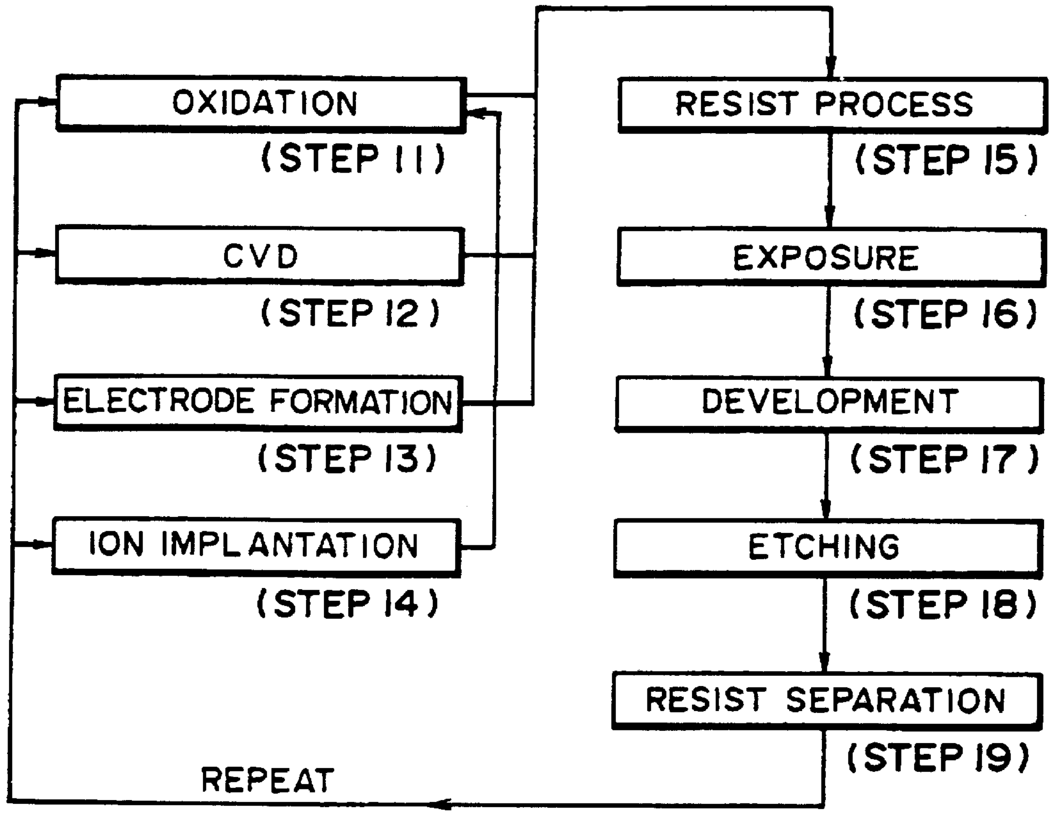
FIG. 12 is a flow chart of a wafer process.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with these embodiments of the present invention as described above, a light intensity distribution on a pupil plane of an optical system, a deviation of a chief ray of exposure light, a tilt of a chief ray of exposure light, or an angular distribution of illumination light projected on a surface to be illuminated (pattern surface of a reticle or wafer) can be measured. Also, on the basis of the result of the measurement, an optical position of a component or components of an illumination system may be adjusted to assure that the illumination light is supplied at an optimum angle. Thus, the present invention provides an exposure apparatus or a device manufacturing method by which a pattern of a mask or reticle can be projected onto a workpiece with a high resolving power.

Further, these embodiments provide an exposure apparatus or a device manufacturing method by which an angular distribution of illumination light impinging on a projection optical system can be measured and, additionally, a deviation of an angular distribution, particularly, a change in the angular distribution of illumination light due to changing the illumination mode, can be corrected.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for illuminating a pattern of a mask with illumination light from an illumination system and for projecting an image of the pattern onto a substrate through a projection optical system, said apparatus comprising:

masking means included in the illumination system and disposed on a plane optically conjugate with a plane on which the pattern of the mask is disposed, said masking means having a variable-size aperture for defining an exposure area in an image plane of the projection optical system; and an illuminometer disposed at the image plane side of the projection optical system, wherein when the aperture of said masking means is set to such a size that a light intensity distribution on a pupil plane of said projection optical system is projected onto a plane being shifted from the image plane along an optical axis direction, a light receiving surface of said illuminomitor is positioned at the shifted plane so as to detect the light intensity distribution upon the pupil plane, wherein the illumination system includes a movable component for adjusting the light intensity distribution upon the pupil plane.

2. An apparatus according to claim 1, wherein the illumination system comprises secondary light source forming means.

3. An apparatus according to claim 2, wherein the movable component of the illumination system comprises a lens system disposed at a light entrance side of said secondary light source forming means.

4. An apparatus according to claim 2, wherein the movable component of the illumination system comprises a parallel flat plate disposed at a light entrance side of said secondary light source forming means.

5. An apparatus according to claim 2, wherein the movable component of the illumination system comprises an optical member having a wedge shaped section, disposed at a light entrance side of said secondary light source forming means.

6. An apparatus according to claim 2, wherein the movable component of the illumination system comprises a stop member having one of a constant aperture diameter and a variable aperture diameter, disposed at a light entrance side of said secondary light source forming means.

7. An apparatus according to claim 1, further comprising measuring means for measuring non-uniformness of illuminance on the image plane, on the basis of a signal from said illuminometer when the light receiving surface thereof is registered with the image plane, and illuminance correcting means disposed along a light path of the illumination system, for correcting non-uniformness of illuminance on the basis of a signal from said measuring means.

8. A projection exposure apparatus for illuminating a pattern of a mask with illumination light from an illumination system and for projecting an image of the pattern onto a substrate through a projection optical system, said apparatus comprising:

masking means included in the illumination system and disposed on a plane optically conjugate with a plane on which the pattern of the mask is disposed, said masking means having a variable-size aperture for defining an exposure area in an image plane of the projection optical system; and an illuminometer disposed at the image plane side of the projection optical system, wherein when the aperture of said masking means is set to such a size that a light intensity distribution on a pupil plane of said projection optical system is projected onto a plane being shifted from the image plane along an optical axis direction, a light receiving surface of said illuminomitor is positioned at the shifted plane so as to detect the light intensity distribution upon the pupil plane.

9. An apparatus according to claim 8, wherein said illumination system comprises secondary light source forming means.

10. An apparatus according to claim 8, further comprising measuring means for measuring non-uniformness of illuminance on the image plane, on the basis of a signal from said illuminometer when the light receiving surface thereof is registered with the image plane, and illuminance correcting means disposed along a light path of the illumination system, for correcting non-uniformness of illuminance on the basis of a signal from said measuring means.

11. A projection exposure apparatus for illuminating a pattern of a mask with illumination light from an illumination system and for projecting an image of the pattern onto a substrate through a projection optical system, said apparatus comprising:

masking means included in the illumination system and disposed on a plane optically conjugate with a plane on which the pattern of the mask is disposed, said masking means having a variable-size aperture for defining an exposure area in an image plane of the projection optical system; and an illuminometer disposed at the image plane side of the projection optical system, wherein said illuminomitor is movable along an optical axis direction and a direction perpendicular to the optical axis direction, a light receiving surface of said illuminomitor is positioned at the image plane when a light intensity distribution of the image plane is to be detected, and when the light intensity distribution on the pupil plane is to be detected, the aperture of said masking means is set to such a size that a light intensity distribution on the pupil plane of said projection optical system is projected onto a plane being shifted from the image plane along the optical axis direction, while the light receiving surface of said illuminomitor is positioned at the shifted plane, wherein the illumination system includes a movable component for adjusting the light intensity distribution on the pupil plane.

12. An apparatus according to claim 11, wherein the illumination system comprises secondary light source forming means.

13. An apparatus according to claim 12, wherein the movable component of the illumination system comprises a lens system disposed at a light entrance side of said secondary light source forming means.

14. An apparatus according to claim 12, wherein the movable component of the illumination system comprises a parallel flat plate disposed at a light entrance side of said secondary light source forming means.

15. An apparatus according to claim 12, wherein the movable component of the illumination system comprises an optical member having a wedge shaped section, disposed at a light entrance side of said secondary light source forming means.

16. An apparatus according to claim 12, wherein the movable component of the illumination system comprises a stop member having one of a constant aperture diameter and a variable aperture diameter, disposed at a light entrance side of said secondary light source forming means.

17. A projection exposure apparatus for illuminating a pattern of a mask with illumination light from an illumination system and for projecting an image of the pattern onto a substrate through a projection optical system, said apparatus comprising:

masking means included in the illumination system and disposed on a plane optically conjugate with a plane on which the pattern of the mask is disposed, said masking means having a variable-size aperture for defining an exposure area in an image plane of the projection optical system; and an illuminometer disposed at the image plane side of the projection optical system, wherein said illuminomitor is movable along an optical axis direction and a direction perpendicular to the optical axis direction, a light receiving surface of said illuminomitor is positioned at the image plane when a light intensity distribution of the image plane is to be detected, and when the light intensity distribution on the pupil plane is to be detected, the aperture of said masking means is set to such a size that a light intensity distribution on the pupil plane of said projection optical system is projected onto a plane being shifted from the image plane along the optical axis direction, while the light receiving surface of said illuminomitor is positioned at the shifted plane.

18. An apparatus according to claim 17, wherein said illumination system comprises secondary light source forming means.

19. A device manufacturing method comprising the steps of:

exposing a wafer to a device pattern by use of a projection exposure apparatus as recited in any one of claims 1 to 18; and developing the exposed wafer.

* * * * *

UNITED STATES PATENT AND TRADEMARK OFFICE

CERTIFICATE OF CORRECTION

PATENT NO. : 6,333,777 B1
DATED : December 25, 2001
INVENTOR(S) : Hiroshi Sato

It is certified that error appears in the above-identified patent and that said Letters Patent is hereby corrected as shown below:

Column 2,
Line 67, "In" should read -- in --.

Column 3,
Line 1, "plans" should read -- plane --.
Line 12, "sucb" should read -- such --.
Line 42, "above;" should read -- such --.
Line 64, "a" should be deleted.
Line 65, "correction" should read -- a correction --.

Column 5,
Line 6, "blade 12" should read -- blade 12, --.
Line 18, "reticle 14" should read -- reticle 14, --.

Column 8,
Line 22, "CCD" should read -- a CCD --.
Line 23, "distribution" should read -- distribution --.

Column 9,
Line 56, "with" should read -- with the --.

Signed and Sealed this

Twenty-third Day of April, 2002

*Attest:*

JAMES E. ROGAN

*Attesting Officer*

*Director of the United States Patent and Trademark Office*